United States Patent

Bülow et al.

[11] Patent Number: 5,908,668
[45] Date of Patent: Jun. 1, 1999

[54] CURTAIN COATING APPARATUS HAVING A PLANAR DEFLECTOR SURFACE AND METHOD FOR USING THE SAME

[75] Inventors: Hans-Georg Bülow, Lörrach; Diana Niesser, Rheinfelden, both of Germany

[73] Assignee: Ciba Specialty Chemicals Corporation, Tarrytown, N.Y.

[21] Appl. No.: 08/991,523

[22] Filed: Dec. 16, 1997

[30] Foreign Application Priority Data

Dec. 16, 1996 [EP] European Pat. Off. .............. 96810872

[51] Int. Cl.⁶ ................................ B05D 1/30; B05C 5/00
[52] U.S. Cl. .................... 427/420; 118/324; 118/DIG. 4
[58] Field of Search ....................... 427/420; 118/DIG. 4, 118/324

[56] References Cited

U.S. PATENT DOCUMENTS

| | | | |
|---|---|---|---|
| 4,135,477 | 1/1979 | Ridley | 118/325 |
| 4,230,793 | 10/1980 | Losert et al. | 430/315 |
| 5,136,970 | 8/1992 | Saitee et al. | 118/324 |

FOREIGN PATENT DOCUMENTS

| | | | |
|---|---|---|---|
| 0002040 | 11/1978 | European Pat. Off. . | |
| 145648 | 6/1985 | European Pat. Off. | 427/420 |
| 0421466 | 4/1991 | European Pat. Off. . | |
| 3102132 | 8/1982 | Germany . | |
| 6-226196 | 8/1994 | Japan | 427/420 |
| 1086301 | 10/1967 | United Kingdom | 118/DIG. 4 |

OTHER PUBLICATIONS

Derw. Abst. 82–72492 E [35] of DE 3,102,132 (Aug. 1982).
Patent Abst's of Japan. vol. 95 No. 3, Apr. 28, 1995 of JP 06 338,449 A.

Primary Examiner—Katherine A. Bareford
Attorney, Agent, or Firm—David R. Crichton

[57] ABSTRACT

In a process for the coating of boards (4) with a poured material (L), especially for the coating of printed circuit boards with, for example, solder resist, the boards (4) to be coated are transported through and beneath a curtain of poured material descending transversely to the transport direction and the poured material descending in the form of a pouring curtain (LV) thus falls onto the boards (4). The descending pouring curtain (LV) falls onto a planar deflector surface (20) before falling onto the board (4), with an acute angle (α) being formed between the deflector surface (20) and the plane of the pouring curtain (LV), which deflector surface (20) has a cut-off edge (21) at its lower end. After falling onto the deflector surface (20), the poured material runs along that deflector surface (20) downwards towards the cut-off edge (21) and then descends onto the board (4).

8 Claims, 2 Drawing Sheets

CURTAIN COATING APPARATUS HAVING A PLANAR DEFLECTOR SURFACE AND METHOD FOR USING THE SAME

The invention relates to a process and an apparatus for the coating of boards, according to the preambles of the respective independent patent claims.

BACKGROUND OF THE INVENTION

The efficient and fast coating of boards with a poured material is becoming increasingly important, especially with regard to the one-sided or two-sided coating of printed circuit boards, for example with solder resist. For that purpose, for example, the widely known curtain pouring process is used, the basic mode of operation of which is described in EP-A-0 002 040 and also in numerous other protective rights. The curtain pouring process essentially operates by transporting a board to be coated (e.g. the aforementioned printed circuit board) beneath a pouring head. The pouring head is arranged transversely to the transport direction of the board being coated. The poured material (e.g. the solder resist) descends from the pouring head in the form of a pouring curtain and falls onto the board located below the pouring head, while the board is being transported, essentially along a line running transversely to the transport direction. The continuous transportation of the board through and beneath the pouring curtain results in the whole board's being coated with poured material.

That process works perfectly well and it, as well as several variants thereof, is used in the printed circuit board-manufacturing industry for the coating of printed circuit boards. Because there is a clear prevailing trend towards ever smaller finished articles and also, as a result, towards ever fewer and smaller printed circuit boards in each finished article, circuit boards that are printed on both sides are now already used in very large numbers and, in many cases, are even the standard. Such circuit boards that are printed on both sides often also have so-called through-platings.

When such printed circuit boards are being coated, the pouring curtain and, as a result, the poured material naturally falls also onto the regions of the board where such through-platings are provided. Consequently, on the other side of the board and in the through-platings themselves there are formed so-called "blobs of coating", which have to be removed by means of correspondingly lengthy and, as a result, troublesome washing-out. Furthermore, it has emerged that, when the board is coated using the conventional curtain pouring process, the distribution of the poured material along the line of impact of the pouring curtain on the board and, as a result, over the width of the whole board is not always sufficiently homogeneous.

SUMMARY OF THE INVENTION

Accordingly, the invention aims to provide a process and an apparatus for the coating of boards, especially for the coating of printed circuit boards with, for example, solder resist, wherein the disadvantages mentioned above are no longer present or are present only to a very much lesser degree.

As regards the process, that aim is achieved as follows: the descending pouring curtain falls onto a planar deflector surface before falling onto the board, with an acute angle being formed between the deflector surface and the plane of the pouring curtain, which deflector surface has a cut-off edge at its lower end, with the result that the poured material, after falling onto the deflector surface, runs downwards along that deflector surface towards the cut-off edge and then descends onto the board. As a result, for example when printed circuit boards are being coated with solder resist, the formation of blobs of coating on the other side of the printed circuit board and in the through-platings is avoided or very much reduced. Consequently, the subsequent washing-out of any blobs of coating nevertheless formed is considerably less troublesome. Furthermore, the distribution of the poured material, i.e. for example the solder resist, along the line of impact on the board and, as a result, over the width of the whole board is very homogeneous.

In an advantageous variant of the process, the angle formed between the plane of the deflector surface and the plane of the pouring curtain is in the range from 14° to 16° and is especially about 15°. Consequently, especially good results are obtained with regard to the formation of only few blobs of coating and with regard to the homogeneity of the distribution of the poured material over the width of the board.

In a further advantageous variant, an acute angle is formed between the plane of the cut-off edge and a plane perpendicular to the deflector surface. That measure likewise has an advantageous effect as regards the formation of only few blobs of coating and the homogeneity of the distribution of the poured material over the width of the board.

In an especially advantageous development of that process variant, the angle formed between the cut-off edge and the plane perpendicular to the deflector surface is in the range from 30° to 45° and is especially about 30°.

In a further variant of the process, the poured material descending onto the plate from the cut-off edge falls from a height of from 40 mm to about 65 mm onto the board being coated. The afore-mentioned advantageous characteristics of the process according to the invention are further augmented as a result.

As regards the apparatus, the aim is achieved by providing below the pouring head a deflector surface, which has a cut-off edge at its lower end and which is arranged so that an acute angle is formed between the deflector surface and the plane of the pouring curtain and so that the pouring curtain descending from the pouring head towards the boards being coated falls onto the deflector surface, with the result that the poured material, after falling onto the deflector surface, runs along that deflector surface towards the cut-off edge and then descends onto the board. The advantages of such an apparatus correspond to the advantages already mentioned hereinbefore with regard to the process according to the invention.

In an advantageous embodiment of the apparatus according to the invention, the angle formed between the plane of the deflector surface and the plane of the pouring curtain is in the range from 14° to 16° and is especially about 15°. Consequently, especially good results are obtained with regard to the formation of only few blobs of coating and with regard to the homogeneity of the distribution of the poured material over the width of the board.

In a further advantageous embodiment of the apparatus according to the invention, an acute angle is formed between the plane of the cut-off edge and a plane perpendicular to the plane of the deflector surface. That measure likewise has an advantageous effect as regards the formation of only few blobs of coating and the homogeneity of the distribution of the poured material over the width of the board. In an advantageous development of that embodiment of the apparatus according to the invention, the angle formed between the cut-off edge and the plane perpendicular to the deflector surface is in the range from 30° to 45° and is especially about 30°. The afore-mentioned advantageous characteristics of the process according to the invention are further augmented as a result.

In a further advantageous embodiment of the apparatus according to the invention, the cut-off edge is arranged at a distance in the range from 40 mm to 65 mm from the plane of the boards being transported beneath the pouring head. The afore-mentioned advantageous characteristics of the process according to the invention are further augmented as a result.

In a further advantageous embodiment of the apparatus according to the invention, the deflector surface is constructed as a portion of a baffle plate, which is arranged beneath the pouring head but is connected to the pouring head. That embodiment is simple in terms of the construction of the apparatus and does not require any special mounting or alignment of the deflector surface with respect to the pouring curtain because the deflector surface is always arranged together with the pouring head and, since it is connected to the pouring head, is automatically in correct alignment with the pouring curtain.

BRIEF DESCRIPTION OF THE DRAWINGS

The invention is described below in greater detail with reference to the drawing, in which, in diagrammatic views.

DETAILED DESCRIPTION OF THE INVENTION

Figure 1:
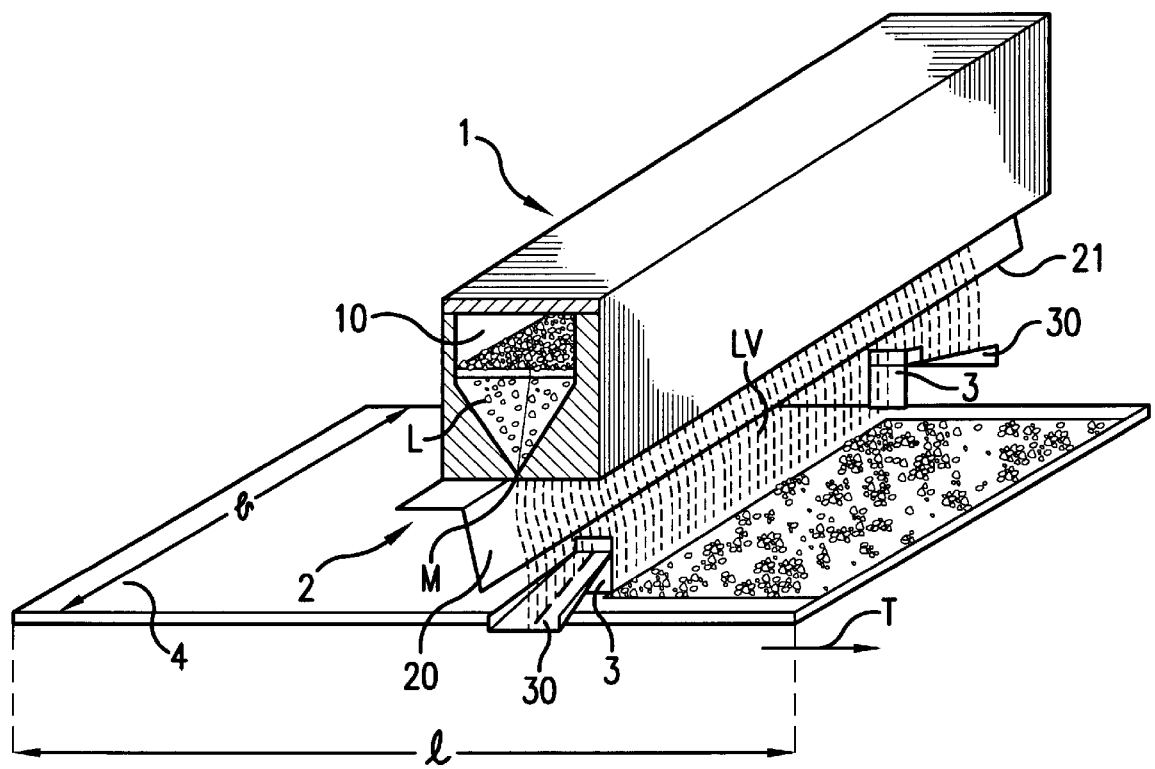
FIG. 1 shows an embodiment of essential parts of an apparatus according to the invention for the coating of, for example, printed circuit boards with, for example, solder resist.

FIG. 1 shows an embodiment of essential parts of the apparatus according to the invention. There can be seen a pouring head 1, wherein material for pouring, for example solder resist L, is held ready in a reservoir 10. The pouring head has on its underside an outlet in the form of a slot 11, through which the solder resist L can flow out of the reservoir and descend in the form of a pouring curtain LV. Below the pouring head 1 there is arranged a planar deflector surface 20, which in FIG. 1 is a portion of a baffle plate 2. The baffle plate 2 is connected to the pouring head 1. FIG. 1 also shows two pouring blades 3, which serve to limit the pouring curtain LV at the sides and each of which has a diversion trough 30. Also shown is a board 4, which is being transported beneath the pouring head 1 in the direction of the arrow T.

The mode of operation of this embodiment is as follows: the solder resist flowing out of the reservoir 10 of the pouring head 1 through the slot 11 (outlet) descends in the form of a curtain firstly onto the deflector surface 20 of the baffle plate 2 and runs downwards along that deflector surface 20 until it reaches a cut-off edge 21 at the lower end of the deflector surface 20. From there, the solder resist descends in the form of a pouring curtain LV. In the region between the two pouring blades 3, the pouring curtain LV falls onto the board 4 (for example a printed circuit board) essentially along a line of impact, whereas the solder resist of the pouring curtain LV outside that region passes into the diversion troughs 30, where it can be caught and fed to a collecting trough (not shown), from which caught solder resist can either be drained off or, alternatively, re-processed and then returned to the reservoir 10 of the pouring head 1 (see FIG. 3).

Figure 2:
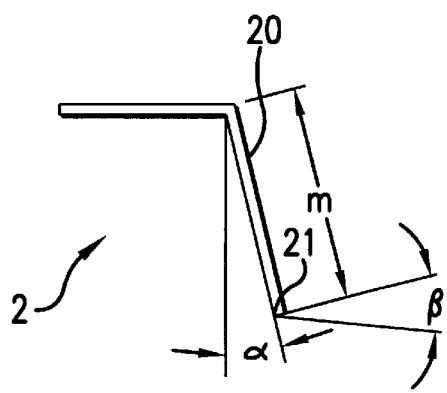
FIG. 2 shows a side view of an embodiment of the deflector surface.

FIG. 2 shows a side view of the baffle plate 2. It will be seen that an acute angle α is formed between the deflector surface 20 and the plane of the pouring curtain, which plane is here represented by a corresponding vertical line LV'. The angle α is in the range from 14° to 16° and is preferably about 15°. On the lower end of the deflector surface 20, a cut-off edge 21 is shown. An acute angle β is formed between the plane of the cut-off edge 21 and a plane perpendicular to the deflector surface 20. The angle β is in the range from 30° to 45° and is preferably about 30°. By using an apparatus of this kind, blobs of coating on the other side of the board 4 or in through-platings are, as already mentioned, completely avoided or so greatly reduced that the subsequent washing-out of such blobs of coating gives rise to only little inconvenience. Above all, however, a very homogeneous distribution of the solder resist is achieved over the entire width of the board 4, that is to say along the line of impact of the pouring curtain LV on the board 4.

In a practical embodiment of the apparatus according to FIG. 1 and FIG. 2, the baffle plate 2 is arranged beneath the pouring head 1 and is connected thereto, the angle α being 15° and the angle β being 30°. The deflector surface 20, along which the poured material runs towards the cut-off edge 21, has a length m of 42 mm. The cut-off edge 21 is arranged at a height h (FIG. 2) of about 6 cm above the plane of the board 4. After passing the cut-off edge 21, the pouring curtain LV then descends through that height h onto the board 4, which has, for example, a width b of 58 cm and a length l of 60 cm. The board 4 is transported through and beneath the pouring curtain LV at a speed of, for example, 1.5 m/s, which results in, for example, the board being coated with a wet weight of about 116.6 g/m$^2$(=7 g/0.06 m$^2$).

Figure 3:
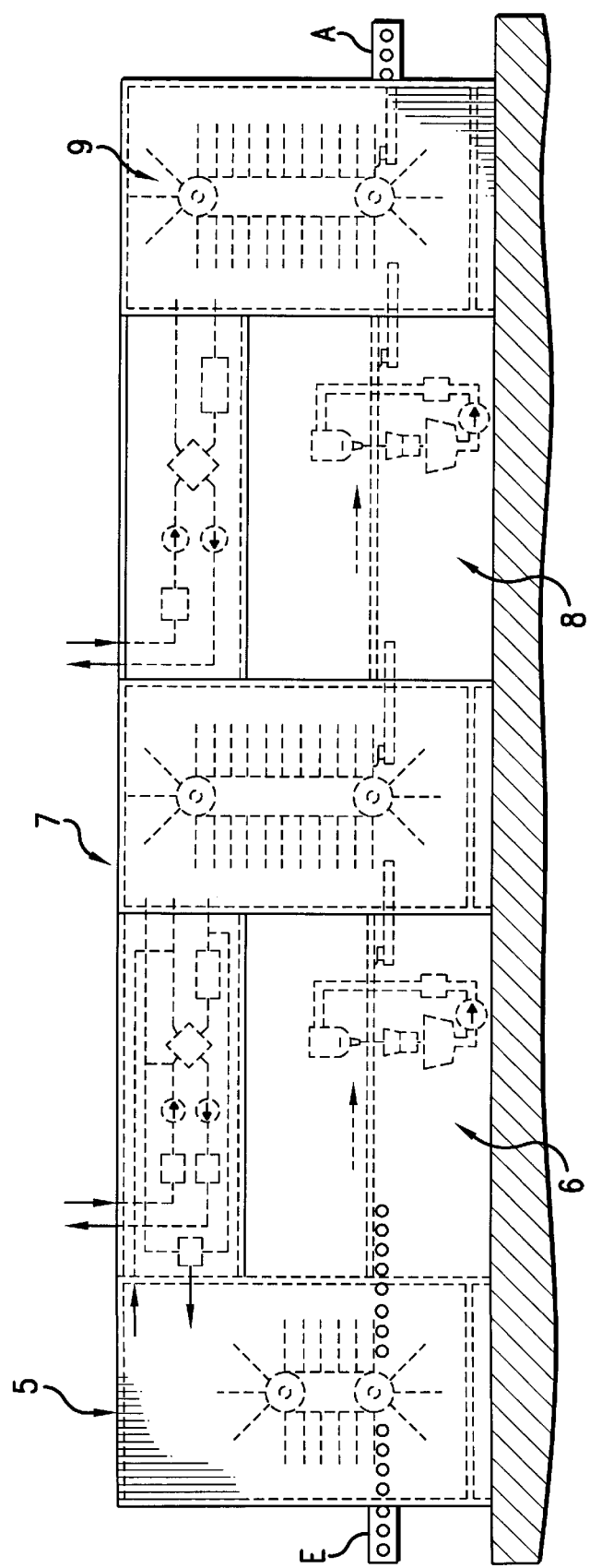
FIG. 3 shows an embodiment of an installation for the two-sided coating of, for example, printed circuit boards with, for example, solder resist.

FIG. 3 shows an embodiment of an installation for the two-sided coating of printed circuit boards with solder resist. The Figure shows an entry track E for the uncoated boards, which are pre-heated in a pre-heating station 5 to a temperature optimised for the relevant board material and the relevant poured material. The boards thus pretreated are then coated in a first coating station 6 according to the curtain pouring process, as has been described with reference to FIG. 1. The coating station 6 is followed by a drying station 7, in which the board, one side of which has been coated, is dried and, at the same time, turned over, so that the other side of the board can be coated in a subsequent, second coating station 8 by means of the curtain pouring process, as has been described with reference to FIG. 1. The board is then dried again in a further drying station 9 before reaching an exit track A. The board, both sides of which have been coated, can then be fed to a further processing stage, for example the poured material can be exposed and, after the exposure, developed, before finally being equipped with components, which are then soldered in. Furthermore, FIG. 3 also shows a number of ventilation modules for supplying air to, and extracting air from, the drying stations and the pre-heating station. The ventilation modules are arranged above the first coating station 6 and the second coating station 8 in order, on the one hand, to save space and, on the other hand, to enable the coating line to be completely enclosed. In order, however, to be able to observe the coating stations 6 and 8 during operation, the side walls of the coating stations 6 and 8 may be transparent, especially made of plexiglass.

The slot 11 of the pouring head is adjustable to control the amount of material which will be discharged.

What is claimed is:

1. A process for the coating of printed circuit boards (4) with a poured material (L) in which process the boards (4) to be coated are transported through and beneath a curtain of poured material descending transversely to the transport direction and the poured material descending in the form of a pouring curtain (LV) thus falls onto the boards (4), in which process the descending pouring curtain (LV) falls along a first plane onto a planar deflector surface (20) constructed as a portion of a baffle plate (2) which is arranged beneath a pouring head (1) and connected to the pouring head (1), before falling onto the board (4), with an angle ($\alpha$) in the range from 14° to 16 being formed between the planar deflector surface (20) and the first plane of the pouring curtain (LV), which deflector surface (20) forms a second plane and has a cut-off edge (21) at its lower end, with the result that the poured material, after falling onto the deflector surface (20), runs along that deflector surface (20) downwards towards the cut-off edge (21) and then descends onto the board (4), wherein an angle ($\beta$) in the range from 30° to 45° is formed between the plane of the cut-off edge (21) and a plane perpendicular to the second plane of the deflector surface (20).

2. A process according to claim 1, wherein the poured material descending onto the board (4) from the cut-off edge falls from a height (h) of from 40 mm to about 65 mm onto the board (4) being coated.

3. A process according to claim 1, wherein the angle ($\alpha$) formed between the plane of the deflector surface and the plane of the pouring curtain is about 15°.

4. A process according to claim 1, wherein the angle ($\beta$) formed between the cut-off edge (21) and the plane perpendicular to the deflector surface (20) is about 30°.

5. An apparatus for the coating of printed circuit boards (4) with a poured material (L), having transport means for transporting the boards (4) beneath a pouring head (1), which is arranged above the plane of the boards being transported and transversely to the transport direction of the boards (4) and from which, for the purpose of coating the boards (4), poured material descends in the form of a pouring curtain (LV) along the first plane, which falls onto the boards being coated while they are being transported beneath the pouring head (1), wherein there is provided below the pouring head (1) a deflector surface (20) forming a second plane and constructed as a portion of a baffle plate (2) which is arranged beneath the pouring head (1) but is connected to the pouring head (1), which has a cut-off edge (21) at its lower end and which is arranged so that an angle ($\alpha$) in the range from 14° to 16° is formed between the planar deflector surface (20) and the first plane of the pouring curtain (LV) and so that the pouring curtain (LV) descending from the pouring head (1) towards the boards (4) being coated falls onto the deflector surface (20), with the result that the poured material, after falling onto the deflector surface (20), runs along that deflector surface (20) towards the cut-off edge (21) and then descends onto the board (4), wherein an angle ($\beta$) in the range from 30° to 45° is formed between the plane of the cut-off edge (21) and a plane perpenicular to the plane of the deflector surface (20).

6. An apparatus according to claim 5, wherein the cut-off edge (21) is arranged at a distance (h) in the range from 40 mm to 65 mm from the plane of the boards (4) being transported beneath the pouring head (1).

7. An apparatus according to claim 5, wherein the angle ($\alpha$) formed between the plane of the deflector surface (20) and the plane of the pouring curtain (LV) is about 15°.

8. An apparatus according to claim 5, wherein the angle ($\beta$) formed between the cut-off edge (21) and the plane perpendicular to the deflector surface (20) is about 30°.

* * * * *